United States Patent
Higuchi

Patent Number: 5,936,560
Date of Patent: Aug. 10, 1999

[54] DATA COMPRESSION METHOD AND APPARATUS PERFORMING HIGH-SPEED COMPARISON BETWEEN DATA STORED IN A DICTIONARY WINDOW AND DATA TO BE COMPRESSED

[75] Inventor: Taihoh Higuchi, Kawasaki, Japan

[73] Assignee: Fujitsu Limited, Kawasaki, Japan

[21] Appl. No.: 08/896,658

[22] Filed: Jul. 18, 1997

[30] Foreign Application Priority Data

Dec. 4, 1996 [JP] Japan .................................. 8-344099

[51] Int. Cl.⁶ .............................. G06F 5/00; H03M 7/30
[52] U.S. Cl. .............................................. 341/106; 341/50
[58] Field of Search .............................. 341/50, 51, 60, 341/63, 106, 65

[56] References Cited

U.S. PATENT DOCUMENTS

| | | | |
|---|---|---|---|
| 4,464,650 | 8/1984 | Eastman et al. | 340/347 DD |
| 4,558,302 | 12/1985 | Welch | 340/347 DD |
| 4,701,745 | 10/1987 | Waterworth | 340/347 DD |
| 4,847,619 | 7/1989 | Kato et al. | 341/106 |
| 4,870,415 | 9/1989 | Van Maren et al. | 341/94 |
| 5,003,307 | 3/1991 | Whiting et al. | 341/51 |
| 5,016,009 | 5/1991 | Whiting et al. | 341/67 |
| 5,126,739 | 6/1992 | Whiting et al. | 341/106 |
| 5,146,221 | 9/1992 | Whiting et al. | 341/67 |
| 5,771,011 | 6/1998 | Masenas | 341/51 |

FOREIGN PATENT DOCUMENTS

5-341953   12/1993   Japan .

Primary Examiner—Brian Young
Assistant Examiner—Peguy JeanPierre
Attorney, Agent, or Firm—Staas & Halsey

[57] ABSTRACT

A dictionary window storing a history of data to be compressed is compared with data to be compressed, and, when a data match is found, a code indicating a length of the data match and a code indicating a relative position of data in the dictionary window that produced the data match are generated. In the comparison, m groups of data in the dictionary window, each of the m groups including a total of n data, are compared substantially simultaneously with a total of n data in the data to be compressed, where m=2, 3, . . . and n=2, 3, . . . , and the compressed data is generated by encoding the data that produced the longest data match.

27 Claims, 6 Drawing Sheets

Window="The' Cruelty of Really Tea"

string1: "The Cruelty of Re"
string2: "he Cruelty of Rea"
string3: "e Cruelty of Real l"
string4: " Cruelty of Real l"
string5: "Cruelty of Really"
string6: "ruelty of Really"
string7: "uelty of Really T"
string8: "elty of Really Te"

DATA COMPRESSION METHOD AND APPARATUS PERFORMING HIGH-SPEED COMPARISON BETWEEN DATA STORED IN A DICTIONARY WINDOW AND DATA TO BE COMPRESSED

BACKGROUND OF THE INVENTION

1. Field of the Invention

The present invention generally relates to data compression methods and apparatuses and, more particularly, to a lossless data compression method and apparatus capable of reconstructing original data used, for example, in a computer system.

2. Description of the Related Art

As computers are used in more advanced applications, the volume of programs and data processed by a computer increases rapidly. This challenge has been met by increased efficiency of recording mediums and increased transmission rates in a computer system. Data compression methods for compressing data to a smaller size have been employed in order to attain a further increase in transmission rate and ease of use in handling data.

Two modes of data compression are known. In one of these modes, redundancy of information is reduced by transforming the information so that its size is reduced but its practical validity is not lost. Such a mode of compression is applied to information such as speech data and image data which depend on human sensitivity for interpretation. In the other mode, redundancy (repetition of data) is exploited to compress original data in a lossless manner so that the original data can be completely reconstructed. Such a mode of compression is applied primarily to information such as numerical data, document data and program codes, which should be accurate digital data.

One of the most widely used lossless data compression methods is the LZ77 method invented by Lampel and Ziv. The LZ77 method uses a portion of previous data as a dictionary. Also widely used are the LZ78 method and the LZW method. The LZ78 method and the LZW method also generate a dictionary from previous data and are known as an elaboration of the LZ77 method.

A description will now be given of the LZ77 data compression method.

In the LZ77 method, data to be compressed is compared with a range of previous data. A search is made in the range for the longest match with the data to be compressed. Compressed data is created from information indicating the relative position of the longest match in the range and the length of the match.

Figures 1A, 1B:
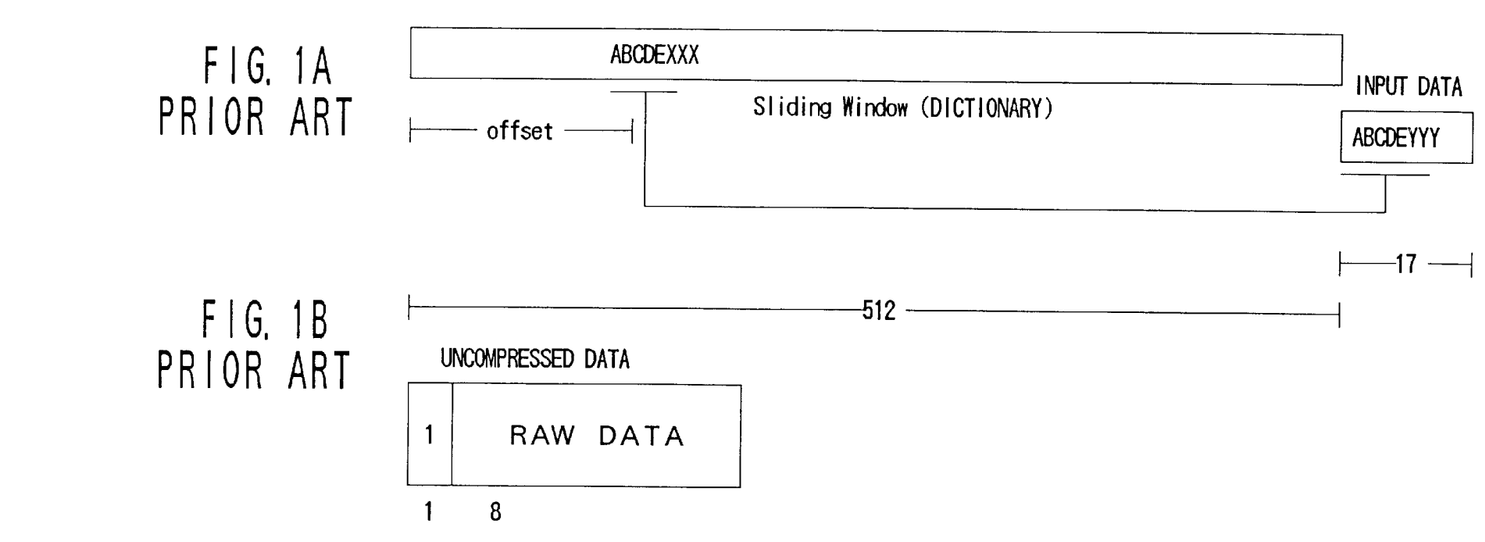
FIG. 1A shows data to be compressed (input data) and a predetermined range of previous data (sliding window) to be compared with the input data.
FIG. 1B shows uncompressed data.
Figure 1C:
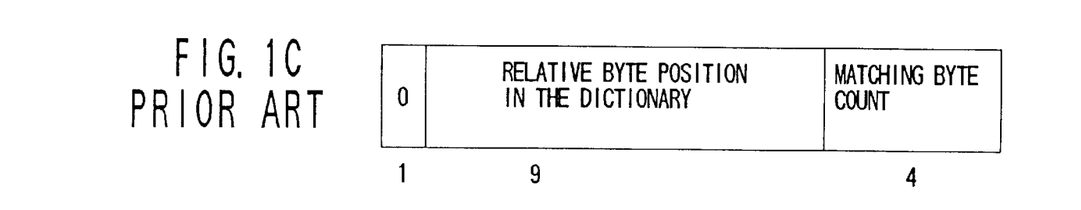
FIG. 1C shows compressed data.

FIGS. 1A, 1B and 1C illustrate a sample operation of the LZ77 data compression method that is generally practiced. FIG. 1A shows data to be compressed (input data) and a predetermined range of previous data (sliding window) to be compared with the input data. FIG. 1B shows uncompressed data. FIG. 1C shows compressed data. Generally, the input data and the previous data are contiguous with each other.

In the LZ77 method shown in FIGS. 1A, 1B and 1C, the unit size of the input data to be compressed (maximum match length) is set to 17 bytes and the window size is set to 512 bytes. In the LZ77 method, the predetermined range of the previous data is processed as a sliding dictionary. The input data to be compressed is first compared with the data in the sliding dictionary. The comparison is performed using a binary tree search described later.

In the aforementioned comparison, a search for the longest match with the 17-byte input data is started at the head of the sliding dictionary. The location of the match (relative byte position) and the length of the match (matching byte count) are encoded using 14-bit compression codes.

Bit 1 of the compressed data indicates a Prefix. The Prefix "1" indicates that the next 13-bit data is compressed data (compressed Token). The Prefix "0" indicates that the next 8-bit data is 1-byte uncompressed data.

The 9 bits following the Prefix in the compressed data indicate the relative byte position (address), in the sliding dictionary, of the data that matched the input data. In the example of FIGS. 1A, 1B and 1C, the size of the sliding dictionary is set to 512 ($=2^9$). Thus, 9 bits are required to indicate the relative byte position.

The 4 bits in the compressed data following the bits indicating the relative byte position indicate the length of the match with the input data. In the above example, the size of the input data is set to 17 bytes so that the maximum value of the matching byte count is 17. When the matching byte count is 1, compression of the 1-byte (8 bits) data produces an increase in the data size from 8 bits to 14 bits. Therefore, no benefit results from data compression. In this case, the original data is transmitted as uncompressed data of 9 bits.

When the matching byte count is 2, conversion of the 2-byte (16 bits) data into compressed data produces a decrease from 16 bits to 14 bits. Thus, data compression proves beneficial. That is, compression according to LZ77 of 2-byte repeated data results in a compression ratio better than 1:1. When a match for the entire 17 bytes is found, the 136 bits (8 bits×17) is compressed to 14 bits for transmission. Since the matching byte count ranges between 2 and 17, 4 bits are used to indicate the matching byte count.

As described above, when a data string producing a matching byte count of 2 or greater is not found in the sliding dictionary as a result of the comparison, the raw data is transmitted as uncompressed data. When the input data has been compared with the sliding dictionary, the input data and the sliding dictionary are shifted by 1 byte for a subsequent comparison.

According to the data compression described above, a compression ratio of 1:2–1:3 is achieved. In order for this data compression to be performed effectively, means for conducting a high-speed search in the sliding dictionary for a longest match with the input data is required. Conventionally, the binary-tree search is widely used as such means. In the binary-tree search, a search tree is built up by arranging the data strings in the sliding dictionary in accordance with a predetermined algorithm (described later in detail). The input data is traced through this search tree and compared with nodes of the tree in order to find a location of the data string that produces a longest match. When the comparison is completed, the position of the window is shifted by 1 byte so that the dictionary is updated.

A description will now be given of the operation of the binary-tree search.

Figure 2:
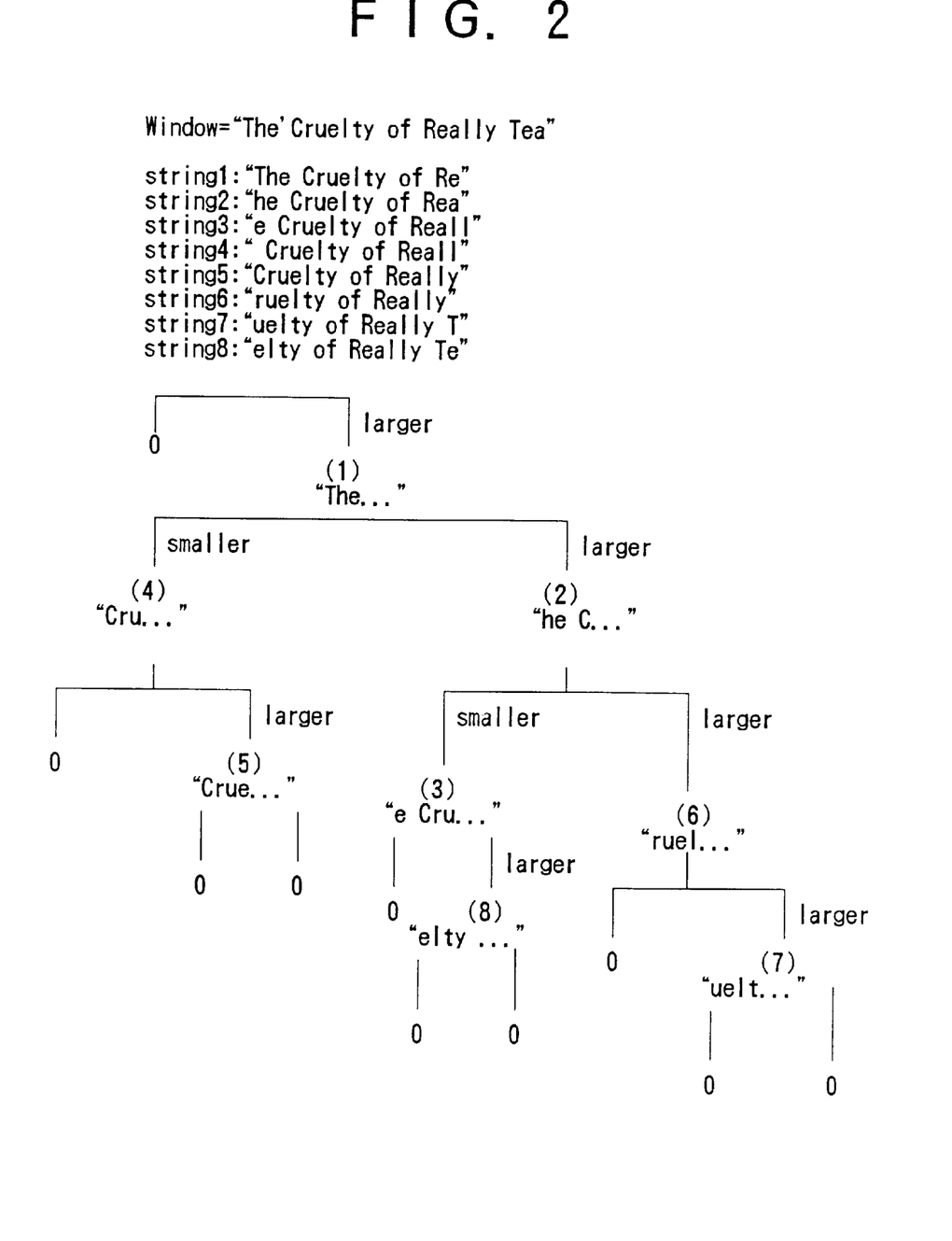
FIG. 2 illustrates the operation of the binary-tree search.

FIG. 2 illustrates the operation of the binary-tree search. In the example shown in FIG. 2, it is assumed that the character string "The Cruelty of Really Tea" is compared with the subsequent 17-character string (not shown). That is, the character string "The Cruelty of Really Tea" is defined as a window (sliding dictionary). The first 17 characters constitute string1. String1 is successively shifted to the left by 1 byte so as to obtain string2, string3, string4, string5, string6, string7 and string8. Each of these strings is compared with the input data.

Before the comparison, a binary tree as shown in FIG. 2 is built up for the character string "The Cruelty of Really Tea". In the binary-tree search, levels are assigned to different types of characters such that a space, characters A–Z and characters a–z have increasingly higher levels in the stated order.

For example, when string1 is compared with string2, it is determined that the character "h" at the head of string2 is higher in level than the character "T" at the head of string1. Therefore, string2 is stored in a branch associated with a higher level (the right branch in the illustration). Comparing string2 with string3, it is found that the character "h" at the head of string2 is higher in level than the character "e" at the head of string3. Therefore, string3 is stored in a branch associated with a lower level (the left branch in the illustration) with respect to string2.

Comparing string3 with string4, it is found that the character "h" at the head of string2 is higher in level than the character "C" at the head of the string4. Further, when string4 is compared with string1, it is found that the character "T" at the head of string1 is higher in level than the character "C" at the head of string4. Therefore, string4 is stored in a branch associated with a lower level with respect to string1. Thus, the tree is built up in accordance with the levels of the characters.

The tree as shown in FIG. 2 enables efficient search of a match with the input data.

However, the data compression according to the related art as described above has the following drawbacks.

(1) Ideally, a search time according to the binary-tree search widely used in data compression is proportional to the logarithm of the window size. Therefore, the binary-tree search can be applied to a large window. However, a relatively long search time is needed depending on the pattern of the input data. A binary tree quite unlike the tree of FIG. 2 may be constructed. For example, most of the child nodes are found to the right of the respective parent nodes or most are found to the left. Such a tree would resemble a straight line. When such a tree is used, substantially exhaustive comparison with the strings may have to be made, thus requiring a long search time. Such a binary-tree search cannot be used in a system operating on real-time processing.

(2) When an ideal binary tree is built up and matches of several byte length are successively found, an assumption can be made that several bytes of data are being processed simultaneously in a data compression operation. However, the window (sliding dictionary) is updated only by 1 byte at a time. Thus, the operation (that is, the updating) that has little to do with data compression presents a bottleneck to the processing speed of data compression.

(3) A binary-tree search determines the next process to be performed based on the immediately preceding operation so that it is not adapted for parallel processing. Therefore, hardware implementation of binary-tree search for speedier processing is difficult.

SUMMARY OF THE INVENTION

Accordingly, a general object of the present invention is to provide a data compression method and apparatus in which the aforementioned drawbacks are eliminated.

Another and more specific object of the present invention is to provide a data compression method and apparatus which enables high-speed data compression irrespective of the pattern of the input data and which can be easily implemented by hardware.

The aforementioned objects can be achieved by a data compression method and apparatus for generating compressed data by comparing a dictionary window storing a history of data to be compressed with the data to be compressed, and by generating, when a data match is found, a code indicating a length of the data match and a code indicating a relative position of data in the dictionary window that produced the data match. The comparing function is performed by comparing m groups of data in the dictionary window, each of the m groups comprising a total of n data, with a total of n data in the data to be compressed substantially simultaneously, where m=2, 3, . . . and n=2, 3, . . . . Further, the code generating function is performed by generating the compressed data by encoding data that produced a longest data match as a result of step b).

According to the data compression method and the data compression apparatus of the present invention, data match search time is significantly reduced irrespective of the pattern of the input data.

Step a) may further comprise the steps of: c) incrementing n to n1, where n1=3, 4, . . . , when a n-data match is found; and d) comparing m groups of data in the dictionary window, each of the m groups comprising a total of n1 data, with a total of n1 data in the data to be compressed substantially simultaneously, the comparison being started at a position in the dictionary window at which the n-data match is found.

According to this aspect of the present invention, data match search time is further reduced.

According to preferred embodiments of the present invention, searches for matches of different lengths can be performed using the same hardware (comparison circuits). Therefore, data compression speed can be improved without scaling up the hardware.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

The data compression method and apparatus according to the present invention are designed to perform high-speed comparison between a dictionary window and data to be compressed in the LZ77 data compression method, and as such provide an improvement to the LZ77 data compression method.

Figure 3:
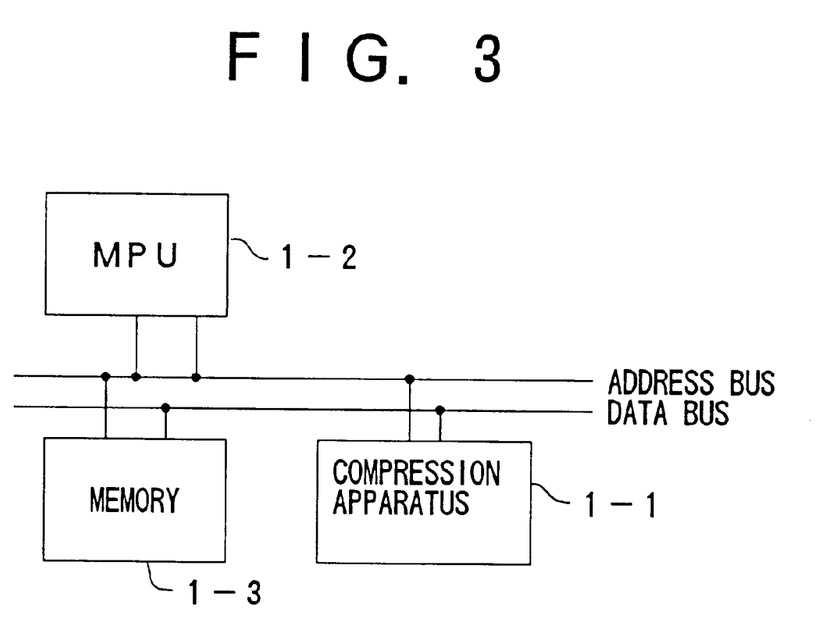
FIG. 3 shows the construction of a system including the data compression apparatus according to the present invention.
Figure 4:
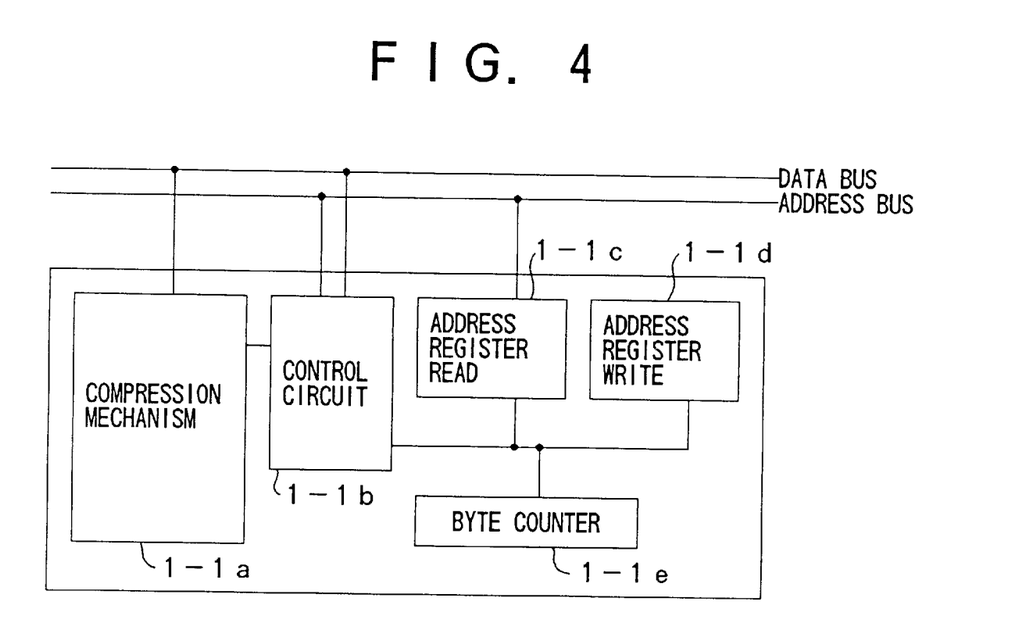
FIG. 4 is a block diagram showing the construction of the data compression apparatus according to the present invention.

FIG. 3 shows the construction of a system including the data compression apparatus according to the present invention. FIG. 4 is a block diagram showing the construction of the data compression apparatus according to the present invention. Referring to FIG. 3, a compression apparatus 1-1 is connected to an MPU (microprocessor of a microcomputer) 1-2 and a memory 1-3 via an address bus and a data bus. The compression apparatus 1-1 is controlled by the MPU 1-2. Referring to FIG. 4, the compression apparatus 1-1 comprises a compression mechanism 1-1a, a control circuit 1-1b, an address register read circuit 1-1c, an address register write circuit 1-1d and a byte counter 1-1e. Data compression according to the present invention is mainly performed in the compression mechanism 1-1a.

According to the data compression of the present invention, the dictionary window and the data to be compressed (input data) are compared with each other in a parallel manner and substantially on a real-time basis. Moreover, generation of strings from the window, as is done in the binary-tree search, is omitted and 1-byte shift updating of the dictionary is not necessary. Accordingly, comparisons in the data compression operation are performed at a high speed.

Figure 5:
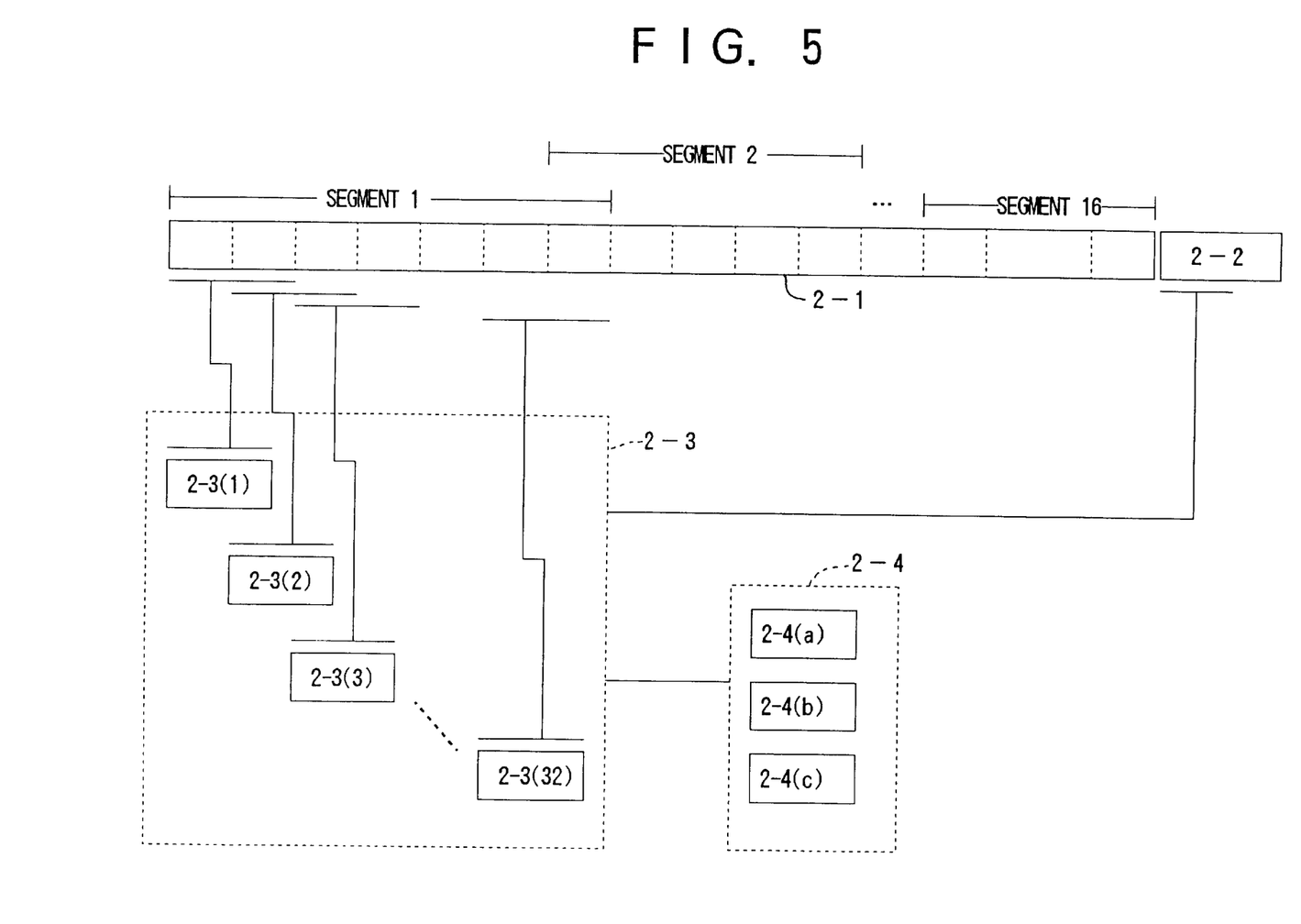
FIG. 5 illustrates the data compression method according to a first embodiment of the present invention.

A description will now be given, with reference to FIG. 5, of a first embodiment according to the present invention. FIG. 5 illustrates how the compression mechanism 1-1a operates to compare the window with the data to be compressed in order to find a match.

The compression mechanism 1-1a comprises a window 2-1 for storing previous data, a register 2-2 for storing the data to be compressed that succeeds the previous data, a comparison unit 2-3 for comparing the previous data in the window 2-1 with the data in the register 2-2 in a parallel manner, and a register 2-4 for storing the result of comparison.

In the first embodiment, the window 2-1 is embodied by a 512-byte shift register and operates as a sliding dictionary. The register 2-2 is embodied by a 17-byte shift register so that the maximum match length is 17 bytes.

The comparison unit 2-3 includes comparison circuits 2-3(1), 2-3(2), ... 2-3(32). Each of the comparison circuits 2-3(1), 2-3(2), ... 2-3(32) compares 2-byte data with each other. For example, the comparison circuit 2-3(1) compares a pair composed of the first and second data in the window 2-1 with a pair composed of the first and second data stored in the register 2-2. The comparison circuit 2-3(2) compares a pair composed of the second and third data in the window 2-1 with the pair composed of the first and second data stored in the register 2-2.

Similarly, the comparison circuit 2-3(3) compares a pair composed of the third and fourth data in the window 2-1 with the pair composed of the first and second data stored in the register 2-2. The comparison circuit 2-3(32) compares a pair composed of the thirty-second and thirty-third data in the window 2-1 with the pair composed of the first and second data stored in the register 2-2.

Thus, a total of 32 pairs of data, involving all of the first through thirty-third data in the window 2-1, are simultaneously compared with the pair composed of the first and second data to be compressed. The first through thirty-third data constitute a segment 1.

After the 32 pairs have been subject to comparison, the comparison circuits 2-3(1)–2-3(32) simultaneously compare a pair composed of the thirty-third and thirty-fourth data in the window 2-1 with the pair composed of the first and second data stored in the register 2-2, compare a pair composed of the thirty-fourth and thirty-fifth data in the window 2-1 with the pair composed of the first and second data stored in the register 2-2, ... and so on through a pair composed of the sixty-fourth and sixty-fifth data in the window 2-1. The thirty-third through sixty-fifth data constitute a segment 2. Thus, in the case of 2-byte comparison, segments 1 through 16 are set in the 512-byte window. In each of the segments, comparisons on the 32 pairs are performed simultaneously.

The results of comparisons on 32 pairs in each segment are stored in the register 2-4. The register 2-4 includes registers 2-4(a), 2-4(b) and 24(c). The register 2-4(a) stores the number associated with the segment in which the comparisons are performed. The register 2-4(b) stores an index indicating a position at which the longest match (in this example, the 2-byte match) starts. The register 2-4(c) stores the match count.

If, as a result of the comparisons on the 32 pairs, no 2-byte match is found, search for a match in the next segment is started. If a 2-byte match is found, a determination is made as to whether the next comparison also produces a match (see the description of the second embodiment for details).

As has been described, the first embodiment is configured such that the window is divided into a plurality of segments. A plurality of comparisons are simultaneously performed at a plurality of starting points in each segment so as to detect the longest match. Therefore, the window and the data to be compressed are compared with each other at a high speed. Accordingly, high-speed data compression is achieved.

The number of bytes subject to comparison in each of the comparison circuits in the comparison unit 2-3 and the number of comparison circuits may be determined by considering a tradeoff between search speed and hardware scale. As described with reference to the related art, no benefit results from data compression if comparisons are performed only on 1-byte data. Therefore, it is necessary to compare data of two or more bytes with each other. For example, the number of bytes subject to comparison by each of the comparison circuits may be set to four bytes and thirty-two comparison circuits may be provided. In this case, the circuit scale would be double that of the scale of the configuration shown in FIG. 5.

Figure 6:
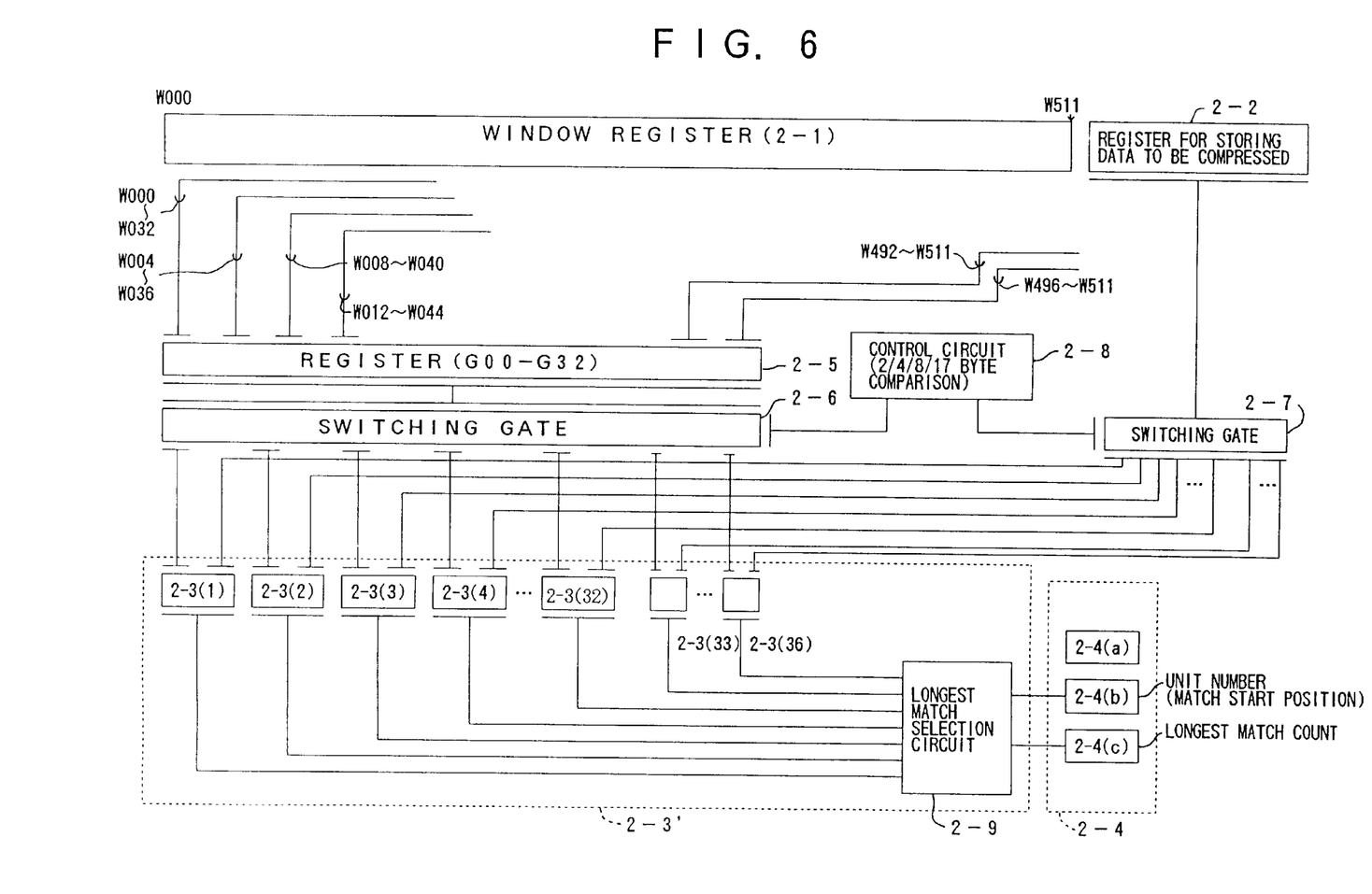
FIG. 6 shows the data compression method according to a second embodiment of the present invention.

A description will now be given, with reference to FIG. 6, of a second embodiment of the present invention. FIG. 6 shows a method which is an improvement of the method of the first embodiment.

In the data compression method shown in FIG. 6, a search is started in the segment 1 for a 2-byte match with the first 2-byte data to be compressed. If a 2-byte match is found in a segment, a search is then started, at the address in which the 2-byte match is found, for a 4-byte match with the first four bytes of the data to be compressed. If a 4-byte match is found, a search is then started at the address in which the 4-byte match is found for a 8-byte match with the first four bytes of the data to be compressed.

If a 8-byte match is found, a search is then started at the address in which the 8-byte match is found for a 17-byte match with the first 17 bytes of the data to be compressed.

A description will now be given of the construction of the compression mechanism shown in FIG. 6 and the method of searching for a match using the same.

Like the compression mechanism shown in FIG. 5, the compression mechanism shown in FIG. 6 includes the window register 2-1 for storing the previous data, the register 2-2 for storing the data to be compressed that succeeds the previous data, a comparison unit 2-3' for performing parallel comparison between the previous data in the window register 2-1 and the data stored in the register 2-2, and the register 2-4 for storing comparison results.

The compression mechanism shown in FIG. 6 further includes a register 2-5, switching gates 2-6 and 2-7, and a control circuit 2-8. The comparison unit 2-3' includes the comparison circuits 2-3(1)–2-3(32) for comparing 2-byte data with each other, the comparison circuits 2-3(33)–2-3(36) for comparing 1-byte data with each other, and a longest match selection circuit 2-9.

In the second embodiment, as in the first embodiment, the window register 2-1 is embodied by a 512-byte shift register and operates as a sliding dictionary. The start address of the window 2-1 is indicated by W000 and the 512nd address of the window 2-1 is indicated by W511. The register 2-2 is embodied by a 17-byte shift register so that the maximum match length is 17 bytes.

The register 2-5 temporarily stores a m-byte portion of the data in the window 2-1. In the example shown in FIG. 6, the register 2-5 is capable of storing a maximum of 33 bytes of data G00–G32. The m-byte portion starting at (4×n)th (n=0, 1, 2, . . . ) address in the window is supplied to the register 2-5. Hereinafter, the starting address of the m-byte portion will be referred to as a 4-byte bound. For example, m bytes starting at the address W000, m bytes starting at the address W004, . . . or m bytes starting at the address W496 may be supplied to the register 2-5. The number m is determined depending on the number of bytes to be compared (see the description later for details).

The switching gates 2-6 and 2-7 determine a comparison method for comparing the byte data supplied to the register 2-5 with the data to be compressed, in accordance with an instruction from the control circuit 28. The comparison methods include (a) 2-byte match search, (b) 4-byte match search, (c) 8-byte match search and (d) 17-byte match search.

In 2-byte match search, 4-byte match search and 8-byte match search, the comparison circuits 2-3(1)–2-3(32) in the comparison unit 2-3' are employed. In 17-byte match search, the comparison circuits 2-3(33)–2-3(36) are also used in addition to the comparison circuits 2-3(1)–2-3(32).

A description will now be given of the operation of the data compression method according to the second embodiment.

(a) 2-byte match search (1) 33-byte data in W000–W032 in the window is loaded into the register 2-5 as the byte data G00–G32 (FIG. 6 shows a case of the 2-byte match search). The switching gates 2-6 and 2-7 control comparison circuits 2-3(1)–2-3(32) so that the first 2 bytes of the target data for compression are compared with the byte data G00–G032 in a manner similar to the first embodiment.

Thus, 32 pairs of 2-byte data G00–G01, G01–G02, G02–G03, G03–G04, . . . G30–G31, G31–G32 are compared by the comparison circuits 2-3(1), 2-3(2), 23(3), 2-3(4), . . . 2-3(31), 2-3(32), respectively, with the pair composed of the first and second data to be compressed.

(2) If no 2-byte match is found in the data at W000–W032, the next 33-byte data at the addresses W032–W064 is loaded into the register 2-5 as the byte data G00–G32 for further 2-byte match search.

(b) 4-byte match search

When a 2-byte match is found in the 2-byte match search, 19-byte data starting at the 4-byte bound of the 4 bytes including the starting byte of the matching 2-byte window data is loaded into the register 2-5 as the byte data G00–G18. For example, if the data at W010 in the window is the start of the match, the 19-byte window data starting at W008 (a 4-byte bound) is loaded into the register 2-5. In this case, W008 becomes a current start address. The switching gates 2-6 and 2-7 control the comparison circuits 2-3(1)–2-3(32) so that first 4 bytes of the target data for compression are compared with the byte data G00–G18 loaded into the register 2-5.

For example, sixteen groups of 4-byte data G00–G03, G01–G04, G02–G05, . . . and G15–G18 are compared by the comparison circuit pairs 2-3(1)/2-3(2), 2-3(3)/2-3(4), 2-3(5)/2-3(6), . . . and 2-3(31)/2-3(32), respectively, with the first through fourth byte data in the target data to be compressed.

(4) If a match three or fewer bytes long is found in the byte data G00–G18 stored in the register 2-5, 4-byte match search is continued in the next block (block starting at an address in the window higher than the current start address by 16).

(c) 8-byte match search (5) When a 4-byte match is found, 15-byte data starting at the 4-byte bound of the 4 bytes including the starting byte of the matching 4-byte window data is loaded into the register 2-5 as the byte data G00–G15. For example, if the data at W025 in the window is the start of the match, the 15-byte window data starting at W024 (a 4-byte bound) is loaded into the register 2-5. In this case, W024 becomes a current start address. The switching gates 2-6 and 2-7 control the comparison circuits 2-3(1)–2-3(32) so that first 8 bytes of the target data for compression are compared with the byte data G00–G15 loaded into the register 2-5.

For example, eight groups of 8-byte data G00–G07, G01–G08, G02–G09, . . . and G07–G15 are compared by the comparison circuit groups 2-3(1)/2-3(2)/2-3(3)/2-3(4), 2-3(5)/2-3(6)/2-3(7)/2-3(8), 2-3(9)/2-3(10)/2-3(11)/2-3(12), . . . and 2-3(29)/2-3(30)/2-3(31)/2-3(32), respectively, with the first through eighth byte data in the target data to be compressed.

(6) If a match of seven or fewer bytes long is found in the byte data G00–G15 stored in the register 2-5, the 8-byte match search is continued in the next block (block starting at an address in the window higher than the current start address by 8).

(d) 17-byte match search (5) When a 8-byte match is found, 20-byte data starting at the 4-byte bound of the 4 bytes including the starting byte of the matching 8-byte window data is loaded into the register 2-5 as the byte data G00–G19. For example, if the data at W033 in the window is the start of the match, the 15-byte window data starting at W032 (a 4-byte bound) is loaded into the register 2-5. In this case, W032 becomes a current start address. The switching gates 2-6 and 2-7 control the comparison circuits 2-3(1)–2-3(32) so that first 17 bytes of the target data for compression are compared with the byte data G00–G19 loaded into the register 2-5.

For example, four groups of 17-byte data G00–G16, G01–G17, G02–G18 and G03–G19 are compared by the comparison circuit groups 2-3(1)/2-3(2)/2-3(3)/2-3(4)/2-3(5)/2-3(6)/2-3(7)/2-3(8)/2-3(33), 2-3(9)/2-3(10)/2-3(11)/2-3(12)/2-3(13)/2-3(14)/2-3(15)/2-3(16)/2-3(34), 2-3(17)/2-3(18)/23(19)/2-3(20)/2-3(21)/2-3(22)/2-3(23)/2-3(24)/2-3(35) and 2-3(25)/2-3(26)/2-3(27)/2-3(28)/2-3(29)/2-3(30)/23(31)/2-3(32)/2-3(36), respectively, with the first through seventeenth byte data in the target data to be compressed.

(8) If a match of sixteen or fewer bytes long is found in the byte data G00–G19 stored in the register 2-5, 17-byte match search is continued in the next block (block starting at an address in the window higher than the current start address by 4).

(9) If a 17-byte match is found, comparison is discontinued since there could not be a longer match.

The result of the above-described search is stored in the register 2-4 via the longest match selection, in a manner similar to the first embodiment. The register 2-4 includes the registers 2-4(a), 2-4(b) and 2-4(c). The register 2-4(a) stores the number associated with the segment in which the longest match is found. The register 2-4(b) stores the position at which the data producing the longest match starts. The register 2-4(c) stores the match count. Storage in the register 2-4 could be performed every time a search has been completed.

The data in the register 2-4 is retrieved as compressed data as shown in FIG. 1C.

According to the data compression method described above, the size of a segment portion searched at a time decreases as searches for longer matches are performed. However, this decrease in the scale of search is outweighed by the merit of efficient processing. When a certain amount of data that produced a match has been processed, the next search is required. For example, when the 2-byte match is found, a search time double that of the case where no 2-byte match was found could be consumed. When the 4-byte match is found, a search time double that of the case where no 4-byte match was found could be consumed.

As indicated by the comparison unit 2-3' of FIG. 6, circuits provided in the data compression apparatus to find a byte data match can be adapted for searches of different lengths. Accordingly, high-speed match search can be effected by hardware of a relatively small scale.

The match length in the data compression method of the present invention may not necessarily be increased by the factor of 2 in successive search steps. The match length may be increased in steps of 1 byte or a plurality of bytes depending on the complexity of the circuit and the required search speed. Moreover, the window 2-1 may be implemented by a memory capable of attaining a predetermined speed.

The present invention is not limited to the above described embodiments, and variations and modifications may be made without departing from the scope of the present invention.

What is claimed is:

1. A data compression method for generating compressed data by comparing a dictionary window, storing a history of data to be compressed, with said data to be compressed and by generating, when a data match is found, a code indicating a length of the data match and a code indicating a relative position of data in said dictionary window that produced the data match, comprising the steps of:

a) comparing m groups of data in said dictionary window, each of the m groups comprising a total of n data, with a total of n data in said data to be compressed substantially simultaneously, where m=2, 3, . . . and n=2, 3, . . . ; and b) generating said compressed data by encoding data that produced a longest data match as a result of step a).

2. The data compression method as claimed in claim 1, wherein step a) further comprises:

c) incrementing n to n1, where n1=3, 4, . . . , when a n-data match is found; and d) comparing m groups of data in said dictionary window, each of the m groups comprising a total of n1 data, with a total of n1 data in said data to be compressed substantially simultaneously, the comparison being started at a position in said dictionary window at which the n-data match is found.

3. The data compression method as claimed in claim 2, where step a) further comprises:

e) decrementing m to m1, where m1=1, 2, . . . , when the n-data match is found; and f) comparing m1 groups of data in said dictionary window, each of the m1 groups comprising a total of n1 data, with a total of n1 data in said data to be compressed substantially simultaneously, the comparison being started at a position in said dictionary window at which the n-data match is found.

4. The data compression method as claimed in claim 3, wherein step a) further comprises:

g) incrementing n to i×n and decrementing m to m/i when the n-data match is found, where i=2, 3, . . . ; and h) comparing m/i groups of data in said dictionary window, each of the m/i groups comprising a total of i×n data, with a total of i×n data in said data to be compressed substantially simultaneously, the comparison being started at a position in said dictionary window at which the n-data match is found.

5. A data compression method based on the LZ77 method invented by Lampel and Ziv, the improvement comprising the steps of:

a) comparing m groups of data in a dictionary window, each of the m groups comprising a total of n data, with a total of n data in said data to be compressed substantially simultaneously, where m=2, 3, . . . and n=2, 3, . . . ; and b) generating said compressed data by encoding data that produced a longest data match as a result of step a).

6. The data compression method as claimed in claim 5, wherein said total of n data is n bytes, and a 1-byte shift occurs from group to group in said m groups of n data in said dictionary window.

7. The data compression method as claimed in claim 5, wherein said total of n data in said data to be compressed is a total of n bytes and said total of n data in each of the m groups is a total of n bytes, a shift of one byte being provided from one group to another.

8. A data compression apparatus for generating compressed data comprising:

comparing means for comparing a dictionary window storing a history of data to be compressed with said data to be compressed, said comparing means being provided with a plurality of comparison circuits for comparing m groups of data in said dictionary window, each of the m groups comprising a total of n data, with a total of n data in said data to be compressed substantially simultaneously, where m=2, 3 . . . and n=2, 3, . . . ; and processing means for generating, when a data match is found, a code indicating a length of the data match and a code indicating a relative position of data in said dictionary window that produced the data match, said processing means being provided with generating means for generating said compressed data by encoding data that produced a longest data match as a result of a comparison by said comparing means.

9. The data compression apparatus as claimed in claim 8, wherein:

said comparing means further comprises incrementing means for incrementing n to n1, where n1=3, 4, . . . , when a n-data match is found; and said plurality of comparison circuits compare m groups of data in said dictionary window, each of the m groups comprising a total of n1 data, with a total of n1 data in said data to be compressed substantially simultaneously, the comparison being started at a position in said dictionary window at which the n-data match is found.

10. The data compression apparatus as claimed in claim 9, wherein:

said comparing means further comprises decrementing means for decrementing m to m1, where m1=1, 2, ..., when the n-data match is found; and said plurality of comparison circuits compare m1 groups of data in said dictionary window, each of the m1 groups comprising a total of n1 data, with a total of n1 data in said data to be compressed substantially simultaneously, the comparison being started at a position in said dictionary window at which the n-data is found.

11. The data compressing apparatus as claimed in claim 10, wherein:

said comparing means further comprises incrementing and decrementing means for incrementing n to i×n and decrementing m to m/i when n-data match is found, where i=2, 3, ...; and said plurality of comparison circuits compare m/i groups of data in said dictionary window, each of the m/i groups comprising a total of i×n data, with a total of i×n data in said data to be compressed substantially simultaneously, the comparison being started at a position in said dictionary window at which the n-data match is found.

12. A data compression apparatus for generating compressed data based on the LZ77 method invented by Lampel and Ziv, the improvement comprising:

comparing means for comparing a dictionary window storing a history of data to be compressed with data to be compressed; and processing means for generating, when a data match is found, a code indicating a length of the data match and a code indicating a relative position of data in said dictionary window that produced the data match; wherein said comparing means further comprises a plurality of comparison circuits for comparing m groups of data in said dictionary window, each of the m groups comprising a total of n data, with a total of n data in said data to be compressed substantially simultaneously, where m=2, 3, ... and n=2, 3, ...; and said processing means further comprises generating means for generating said compressed data by encoding data that produced a longest data match as a result of a comparison by said comparing means.

13. The data compression apparatus as claimed in claim 12, wherein said total of n data in said data to be compressed is a total of n bytes and said total of n data in each of the m groups is a total of n bytes, a shift of one byte being provided from one group to another.

14. A data compression method for generating compressed data, comprising:

comparing a dictionary window, storing a history of data to be compressed, with said data to be compressed in accordance with comparing m groups of data in said dictionary window, each of the m groups comprising a total of n data, with a total of n data in said data to be compressed substantially simultaneously, where m=2, 3, ... and n=2, 3, ...; and generating, when a data match is found, a code indicating a length of the data match and a code indicating a relative position of data in said dictionary window that produced the data match, and generating said compressed data by encoding data that produced a longest data match as a result of the comparing step.

15. The data compression method as claimed in claim 14, wherein step a) further comprises:

c) incrementing n to n1, where n1=3, 4, ..., when a n-data match is found; and d) comparing m groups of data in said dictionary window, each of the m groups comprising a total of n1 data, with a total of n1 data in said data to be compressed substantially simultaneously, the comparison being started at a position in said dictionary window at which the n-data match is found.

16. The data compression method as claimed in claim 15, where step a) further comprises:

e) decrementing m to m1, where m1=1, 2, ..., when the n-data match is found; and f) comparing m1 groups of data in said dictionary window, each of the m1 groups comprising a total of n1 data, with a total of n1 data in said data to be compressed substantially simultaneously, the comparison being started at a position in said dictionary window at which the n-data match is found.

17. The data compression method as claimed in claim 16, wherein step a) further comprises:

g) incrementing n to i×n and decrementing m to m/i when the n-data match is found, where i=2, 3, ...; and h) comparing m/i groups of data in said dictionary window, each of the m/i groups comprising a total of i×n data, with a total of i×n data in said data to be compressed substantially simultaneously, the comparison being started at a position in said dictionary window at which the n-data match is found.

18. A data compression apparatus, comprising:

a comparator comparing a dictionary window storing a history of data to be compressed with data to be compressed, said comparator further comprising a plurality of comparator circuits substantially simultaneously comparing m groups of data in said dictionary window, each of the m groups comprising a total of n data, with a total of n data in said data to be compressed, where m=2, 3, ... and n=2, 3, ...; and a processor generating, when a data match is found, a code indicating a length of the data match and a code indicating a relative position of data in said dictionary window that produced the data match, said processor further comprising a generator generating compressed data by encoding data that produced a longest data match as a result of the comparison by said comparator.

19. The data compression apparatus as claimed in claim 18, wherein:

said comparator further comprises an incrementing unit incrementing n to n1, where n1=3, 4, ..., when a n-data match is found; and said plurality of comparator circuits compare m groups of data in said dictionary window, each of the m groups comprising a total of n1 data, with a total of n1 data in said data to be compressed substantially simultaneously, the comparison being started at a position in said dictionary window at which the n-data match is found.

20. The data compression apparatus as claimed in claim 19, wherein:

said comparator further comprises a decrementing unit decrementing m to m1, where m1=1, 2, ..., when the n-data match is found; and said plurality of comparator circuits compare m1 groups of data in said dictionary window, each of the m1 groups comprising a total of n1 data, with a total of n1 data in said data to be compressed substantially simultaneously, the comparison being started at a position in said dictionary window at which the n-data is found.

21. The data compressing apparatus as claimed in claim 20, wherein:

said comparator further comprises an incrementing and decrementing unit incrementing n to i×n and decrementing m to m/i when n-data match is found, where i=2, 3, . . . ; and said plurality of comparator circuits compare m/i groups of data in said dictionary window, each of the m/i groups comprising a total of i×n data, with a total of i×n data in said data to be compressed substantially simultaneously, the comparison being started at a position in said dictionary window at which the n-data match is found.

22. A data compression method comprising:

a) comparing, substantially simultaneously, m groups of data in a dictionary window, each of the m groups comprising a total of n data, with a total of n data in data to be compressed, where m=2, 3, . . . and n=2, 3, ; and b) identifying the compared data that produced longest data match as a result of step a); and c) encoding the identified data and outputting same as compressed data.

23. The data compression method as claimed in claim 22, wherein said total of n data is n bytes, and a 1-byte shift occurs from group to group in said m groups of n data in said dictionary window.

24. The data compression method as claimed in claim 22, wherein said total of n data in said data to be compressed is a total of n bytes and said total of n data in each of the m groups is a total of n bytes, a shift of one byte being provided from one group to another.

25. A data compression apparatus, comprising:

a comparator comparing, substantially simultaneously, m groups of data in a dictionary window, each of the m groups comprising a total of n data, with a total of n data in data to be compressed, where m=2, 3, . . . and n=2, 3, . . . ;

an identifying unit identifying the compared data that produced a longest data match as a result of the comparing by the comparator; and an encoder encoding the identified, compared data that produced the longest data match and outputting same as compressed data.

26. The data compression apparatus as claimed in claim 25, wherein said total of n data is n bytes, and a 1-byte shift occurs from group to group in said m groups of n data in said dictionary window.

27. The data compression apparatus as claimed in claim 25, wherein said total of n data in said data to be compressed is a total of n bytes and said total of n data in each of the m groups is a total of n bytes, a shift of one byte being provided from one group to another.

* * * * *

UNITED STATES PATENT AND TRADEMARK OFFICE
CERTIFICATE OF CORRECTION

PATENT NO.:    5,936,560
DATED     :    August 10, 1999
INVENTOR(S):   Taihoh HIGUCHI It is certified that error appears in the above-identified patent and that said Letters Patent is hereby corrected as shown below:

On the Title Page, [30] Foreign Application Priority Data, change "Dec. 4, 1996" to --Dec. 24, 1996--.

Signed and Sealed this

Seventh Day of December, 1999

*Attest:*

Q. TODD DICKINSON

*Attesting Officer*   Acting Commissioner of Patents and Trademarks